(12) United States Patent
Chen

(10) Patent No.: US 9,875,387 B2
(45) Date of Patent: Jan. 23, 2018

(54) FINGERPRINT SENSOR AND PACKAGING METHOD THEREOF

(71) Applicant: Egis Technology Inc., Taipei (TW)

(72) Inventor: Pin-Yu Chen, Taipei (TW)

(73) Assignee: Egis Technology Inc., Taipei (TW)

( * ) Notice: Subject to any disclaimer, the term of this patent is extended or adjusted under 35 U.S.C. 154(b) by 0 days.

(21) Appl. No.: 15/212,116

(22) Filed: Jul. 15, 2016

(65) Prior Publication Data

US 2017/0330017 A1 Nov. 16, 2017

(30) Foreign Application Priority Data

May 16, 2016 (TW) .............................. 105115027 A

(51) Int. Cl.
*G06K 9/00* (2006.01)
*H01L 23/498* (2006.01)
(Continued)

(52) U.S. Cl.
CPC ........ *G06K 9/00013* (2013.01); *H01L 21/486* (2013.01); *H01L 21/4853* (2013.01);
(Continued)

(58) Field of Classification Search
CPC .......... G06K 9/00013; H01L 23/49811; H01L 23/3114; H01L 21/565; H01L 21/486;
(Continued)

(56) References Cited

U.S. PATENT DOCUMENTS 8,717,775 B1 * 5/2014 Bolognia ........... G06K 9/00053
361/761
2008/0173792 A1 * 7/2008 Yang ................. H01L 27/14618
250/208.1
(Continued)

FOREIGN PATENT DOCUMENTS

KR  10-2006-0020499  3/2006
KR  10-2015-0144937  12/2015
(Continued)

OTHER PUBLICATIONS

Korea Patent Office, Office Action, Patent Application Serial No. 10-2016-0105893, dated May 12, 2017, Korea.

*Primary Examiner* — Marcos D Pizarro
*Assistant Examiner* — Sue Tang

(57) ABSTRACT

A fingerprint sensor is provided. The fingerprint sensor includes a multi-layer printed circuit board (PCB), a fingerprint sensing die and a molding compound. The multi-layer PCB includes a bottom dielectric layer, at least one intermediate dielectric layer disposed on the bottom dielectric layer, a top dielectric layer disposed on the intermediate dielectric layer and a trench. The trench is formed by digging out a portion of the intermediate dielectric layer and a portion of the top dielectric layer. The fingerprint sensing die is disposed in the trench of the multi-layer PCB and mounted on an upper surface of the bottom dielectric layer of the multi-layer PCB. The fingerprint sensing die includes a sensing array capable of sensing fingerprint information of a user. The fingerprint sensing die is covered by the molding
(Continued)

compound, and the trench of the multi-layer PCB is filled with the molding compound.

11 Claims, 5 Drawing Sheets

(51) Int. Cl.
H01L 23/31 (2006.01)
H01L 23/60 (2006.01)
H01L 21/48 (2006.01)
H01L 21/56 (2006.01)

(52) U.S. Cl.
CPC ........ *H01L 21/4857* (2013.01); *H01L 21/565* (2013.01); *H01L 23/3114* (2013.01); *H01L 23/49811* (2013.01); *H01L 23/49822* (2013.01); *H01L 23/49827* (2013.01); *H01L 23/49838* (2013.01); *H01L 23/60* (2013.01)

(58) Field of Classification Search
CPC ........ H01L 23/49827; H01L 23/49822; H01L 21/4853; H01L 23/60; H01L 21/4857; H01L 23/49838

USPC ........................................................ 257/414
See application file for complete search history.

(56) References Cited

U.S. PATENT DOCUMENTS

| 2009/0021635 | A1* | 1/2009 | Cheng | G02B 13/001 |
| | | | | 348/374 |
| 2010/0103634 | A1* | 4/2010 | Funaya | H01L 23/5389 |
| | | | | 361/761 |
| 2011/0308082 | A1* | 12/2011 | Chen | H05K 3/0008 |
| | | | | 29/852 |
| 2014/0332908 | A1* | 11/2014 | Ho | H01L 21/76877 |
| | | | | 257/414 |
| 2015/0030217 | A1* | 1/2015 | Wickboldt | G06K 9/00026 |
| | | | | 382/124 |
| 2015/0189204 | A1 | 7/2015 | Oganesian et al. | |

FOREIGN PATENT DOCUMENTS

| TW | M462445 | 9/2013 |
| TW | 201439865 | 10/2014 |

\* cited by examiner

FINGERPRINT SENSOR AND PACKAGING METHOD THEREOF

CROSS REFERENCE TO RELATED APPLICATIONS

This Application claims priority of Taiwan Patent Application No. 105115027, filed on May 16, 2016, the entirety of which is incorporated by reference herein.

BACKGROUND OF THE INVENTION

Field of the Invention

The invention relates to a fingerprint sensor, and more particularly to a packaging structure and a packaging method of a fingerprint sensor.

Description of the Related Art

In recent years, biological identification technology has become increasingly mature, and different biological features can be used for identifying users. Since the recognition rate and accuracy of fingerprint identification technology are better than those of other biological feature identification technologies, fingerprint identification and verification are used extensively in various areas. For example, cell phones, tablet computers, personal computers, electronic locks and other electronic devices can be equipped with a fingerprint identification function for identifying the user's identity so as to increase security.

Fingerprint identification and verification technology detects a user's fingerprint pattern, captures fingerprint data from the fingerprint pattern, and saves the fingerprint data to the memory as a template. Thereafter, the user presses or swipes a finger on or over the fingerprint sensor so that a fingerprint is captured and compared with the template. If the two match, then the user's identity is confirmed.

BRIEF SUMMARY OF THE INVENTION

A fingerprint sensor and a packaging method thereof are provided. An embodiment of a fingerprint sensor of the invention is provided. The fingerprint sensor comprises a multi-layer printed circuit board (PCB), a fingerprint sensing die and a molding compound. The multi-layer PCB comprises a bottom dielectric layer, at least one intermediate dielectric layer disposed on the bottom dielectric layer, a top dielectric layer disposed on the intermediate dielectric layer and a trench. The trench is formed by digging out a portion of the intermediate dielectric layer and a portion of the top dielectric layer. The fingerprint sensing die is disposed in the trench of the multi-layer PCB and mounted on an upper surface of the bottom dielectric layer of the multi-layer PCB. The fingerprint sensing die comprises a sensing array capable of sensing fingerprint information of a user. The fingerprint sensing die is covered by the molding compound, and the trench of the multi-layer PCB is filled with the molding compound.

Furthermore, an embodiment of a packaging method for a fingerprint sensor of the invention is provided. An etching process is performed on a multi-layer printed circuit board (PCB), so as to form a trench in the multi-layer PCB, wherein the multi-layer PCB comprises a bottom dielectric layer, at least one intermediate dielectric layer and a top dielectric layer. A fingerprint sensing die is disposed in the trench of the multi-layer PCB, and the fingerprint sensing die is mounted on an upper surface of the bottom dielectric layer of the multi-layer PCB. A molding compound is filled into the trench of the multi-layer PCB, so as to cover the fingerprint sensing die and fill the trench of the multi-layer PCB.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
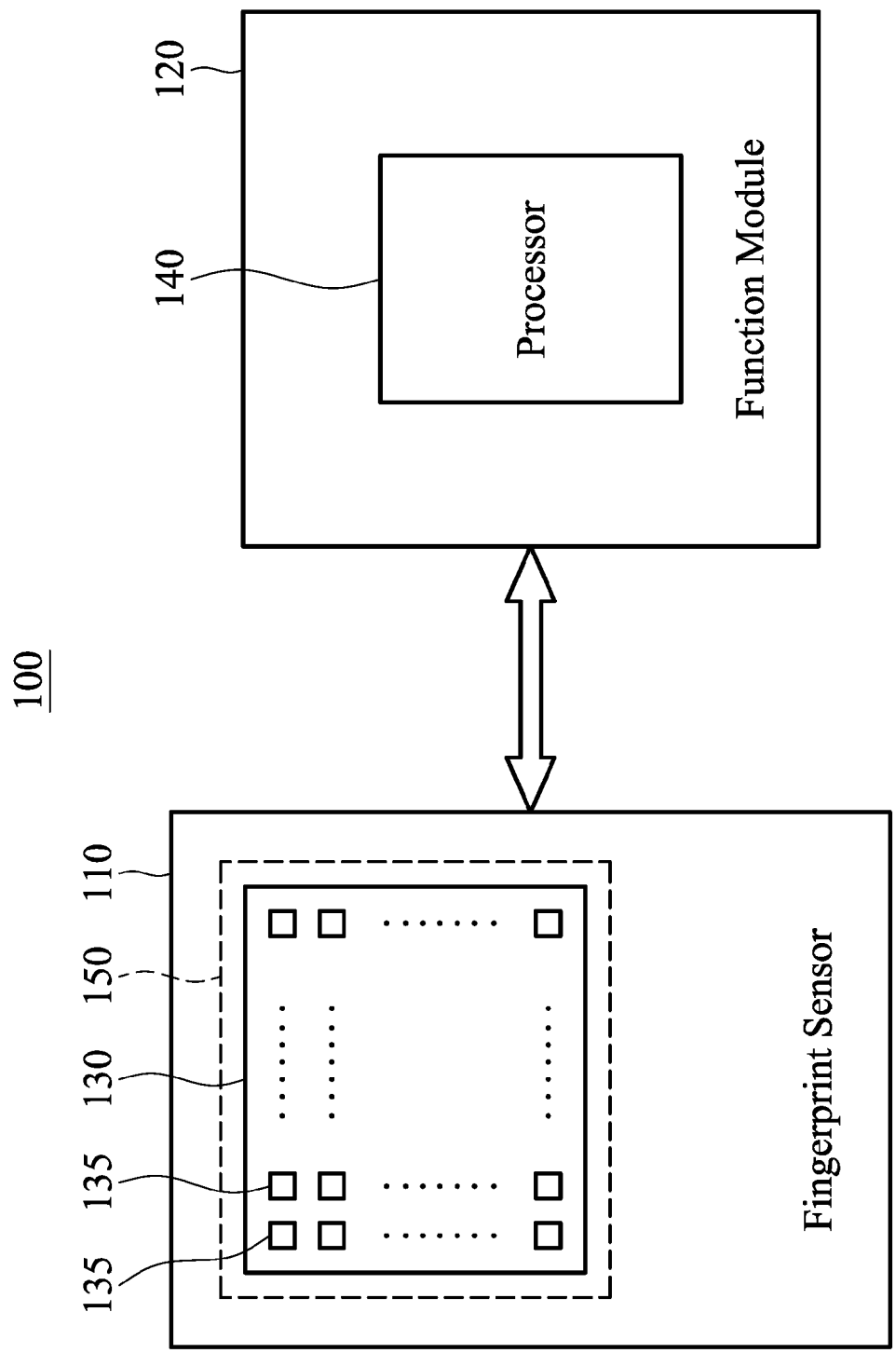
FIG. 1 shows an electronic device according to an embodiment of the invention.

FIG. 1 shows an electronic device 100 according to an embodiment of the invention. The electronic device 100 comprises a fingerprint sensor 110 and a function module 120. The fingerprint sensor 110 comprises a sensing array 130 and an insulating surface 150, wherein the sensing array 130 and the insulating surface 150 are implemented in a fingerprint sensing die. In order to simplify the description, the other circuits (such as the readout circuit) in the fingerprint sensor 110 will not be described further. The sensing array 130 is formed by a plurality of sensing units 135 arranged in a two-dimensional manner, wherein the insulating surface 150 overlays all of the sensing units 135 of the sensing array 130. Furthermore, in the embodiment, the sensing units 135 of the sensing array 130 are arranged in a rectangle. In the embodiment, the function module 120 comprises a processor 140. According to the sensing voltages of the sensing units 135 of the sensing array 130, the fingerprint sensor 110 can provide fingerprint information of a user's finger to the processor 140 of the function module 120. For example, the fingerprint sensor 110 can determine whether the user's finger is in contact with the insulating surface 150 and determine that the sensing voltage corresponds to a fingerprint ridge or a fingerprint valley of the finger. Next, according to the fingerprint information from the fingerprint sensor 110, the processor 140 can use a fingerprint identification algorithm to perform a fingerprint identification operation. In one embodiment, the fingerprint sensor 110 and the function module 120 are disposed on a main circuit board of the electronic device 100.

Figure 2:
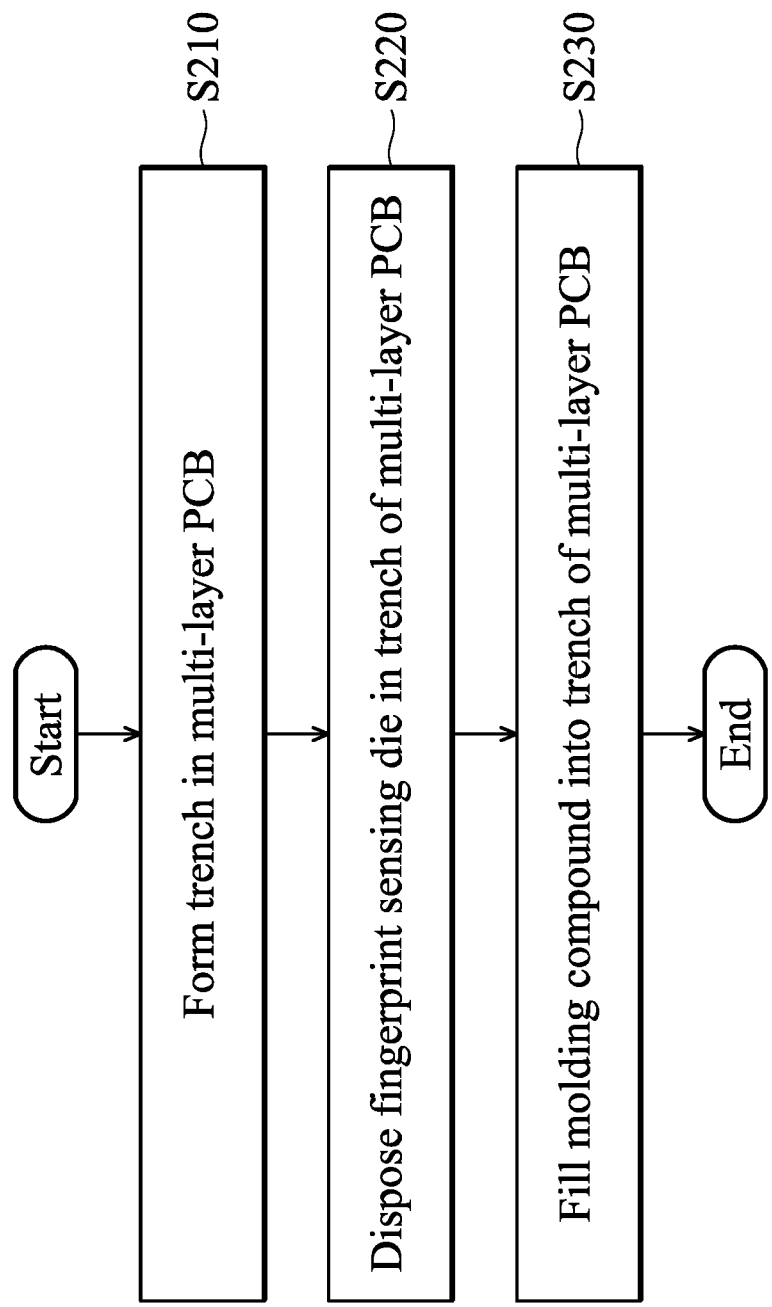
FIG. 2 shows a packaging method for a fingerprint sensor according to an embodiment of the invention, wherein the method of FIG. 2 is performed by a packaging machine.

FIG. 2 shows a packaging method for a fingerprint sensor (e.g. the fingerprint sensor 110 of FIG. 1) according to an embodiment of the invention, wherein the method of FIG. 2 is performed by a packaging machine. First, in step S210, an etching, laser cutting or mechanical cutting process is performed on a multi-layer printed circuit board (PCB), so as to form a trench in the multi-layer PCB, wherein the multi-layer PCB is formed by stacking a plurality of dielectric layers. Furthermore, the etching, laser cutting or mechanical cutting process may be performed before the multi-layer PCB is formed. For example, the etching, laser cutting or mechanical cutting process is performed simultaneously on all dielectric layers of the multi-layer PCB, or the etching, laser cutting or mechanical cutting process is performed on each dielectric layer of the multi-layer PCB in sequence when the dielectric layer is stacked. Next, in step S220, a fingerprint sensing die is disposed in the trench of the multi-layer PCB to mount the fingerprint sensing die on an upper surface of a bottom dielectric layer of the multi-layer PCB, so as to electrically connect the fingerprint sensing die to the signal paths of the bottom dielectric layer. In order to simplify the description, the connection manner of the pins of the fingerprint sensing die and the pads of the multi-layer PCB will not be described further. Next, in step S230, a molding compound is filled into the trench of the multi-layer PCB, so as to cover the fingerprint sensing die and fill the trench completely. Thus, the fingerprint sensing die can be fixed in the trench of the multi-layer PCB. It should be noted that the molding compound has a high dielectric constant (DK). In one embodiment, the molding compound may be an epoxy molding compound (EMC), which is formed in the trench of the multi-layer PCB in a molding process.

Figure 3:
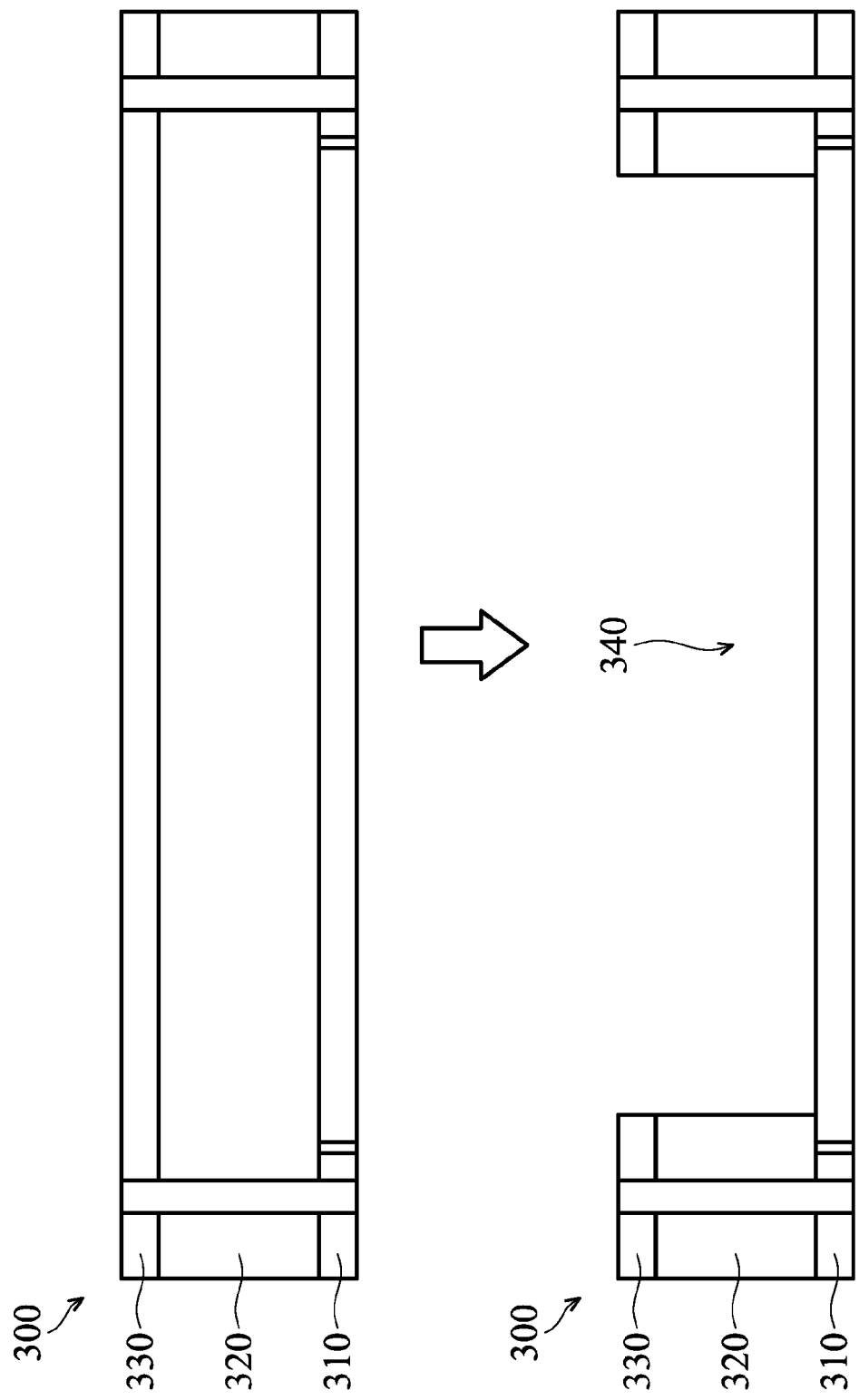
FIG. 3 shows a schematic diagram illustrating an etching process performed on a multi-layer PCB according to an embodiment of the invention.

FIG. 3 shows a schematic diagram illustrating an etching process (e.g. step S210 of FIG. 2) which is performed on a multi-layer PCB 300 according to an embodiment of the invention. The multi-layer PCB 300 comprises a bottom dielectric layer 310, at least one intermediate dielectric layer 320, and a top dielectric layer 330, wherein the bottom dielectric layer 310, the intermediate dielectric layer 320, and the top dielectric layer 330 comprise pre-pregnant (PP) material or FR-4 retardant material. As shown in FIG. 3, after the etching process is performed, a portion of the intermediate dielectric layer 320 and a portion of the top dielectric layer 330 are dug out, so as to form the trench 340 in the multi-layer PCB 300. In the embodiment, the bottom dielectric layer 310 and the top dielectric layer 330 have the same thickness. Furthermore, the thickness of the intermediate dielectric layer 320 is greater than the thickness of the top dielectric layer 330 and the bottom dielectric layer 310. In one embodiment, the multi-layer PCB 300 comprises a plurality of the intermediate dielectric layers 320, and the amount of the intermediate dielectric layers 320 is determined according to a quantity of the signal paths and the layout complexity.

Figure 4:
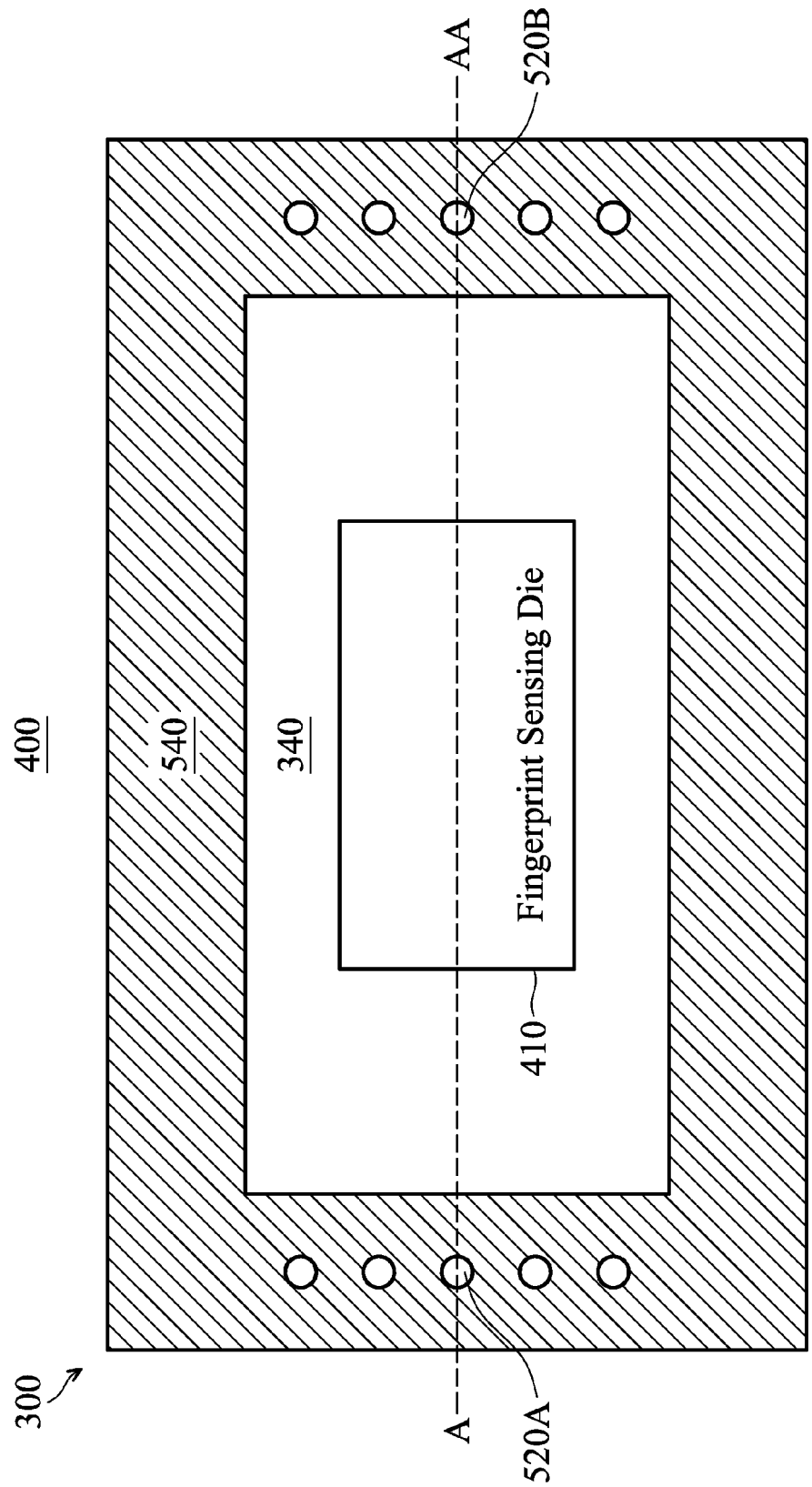
FIG. 4 shows a top view of a fingerprint sensor according to an embodiment of the invention.

FIG. 4 shows a top view of a fingerprint sensor 400 according to an embodiment of the invention. In FIG. 4, a molding compound of the fingerprint sensor 400 is removed to simplify the description, wherein the molding compound of the fingerprint sensor 400 will described below. The fingerprint sensor 400 comprises a fingerprint sensing die 410, and a multi-layer PCB 300. The multi-layer PCB 300 has a trench 340, and the fingerprint sensing die 410 is disposed in the trench 340 of the multi-layer PCB 300. In general, the fingerprint sensing die 410 comprises a sensing array (e.g. the sensing array 130 of FIG. 1), a readout module (not shown) and so on. In the fingerprint sensing die 410, after obtaining a sensing output of the sensing array, the fingerprint sensing die 410 determines whether the user's finger is in contact with the insulating surface of the fingerprint sensor 400 and further obtains the fingerprint information of the finger so as to determine that the sensing output corresponds to a fingerprint ridge or a fingerprint valley of the finger. Next, the fingerprint sensor 400 provides the fingerprint information of the finger to the other circuits or modules of the electronic device (e.g. the function module 120 of FIG. 1) for subsequent processes, for example, a fingerprint identification operation is performed by a fingerprint identification algorithm. In order to simplify the description, the other devices on the multi-layer PCB 300, such as surface mount devices (SMDs), will not be described further.

Figure 5:
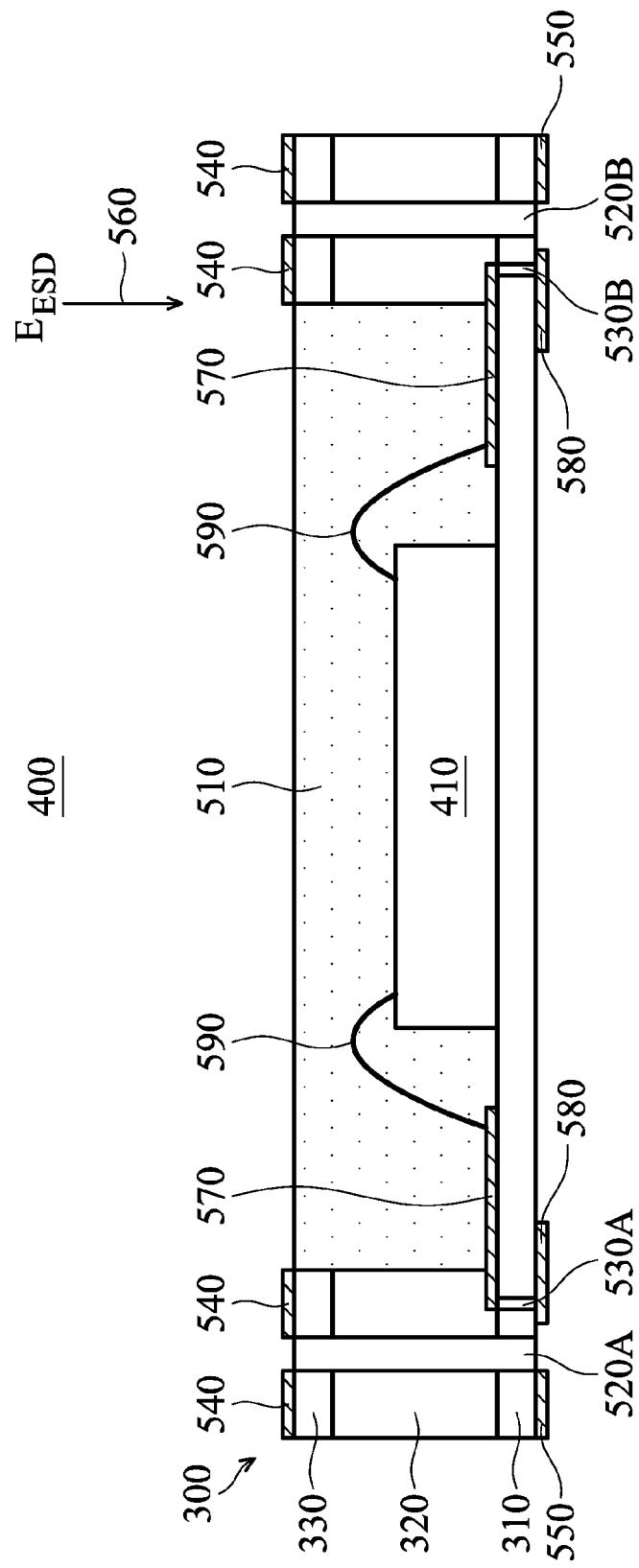
FIG. 5 shows a sectional diagram along a section line A-AA of the fingerprint sensor of FIG. 4.

FIG. 5 shows a sectional diagram along a section line A-AA of the fingerprint sensor of FIG. 4. Referring to FIGS. 4 and 5 together, the fingerprint sensing die 410 is disposed in the multi-layer PCB 300. As described above, the multi-layer PCB 300 comprises a bottom dielectric layer 310, at least one intermediate dielectric layer 320 and a top dielectric layer 330. Furthermore, the trench 340 is formed by digging out a portion of the intermediate dielectric layer 320 and a portion of the top dielectric layer 330 through an etching process. In one embodiment, the intermediate dielectric layer 320 is a core insulator. The fingerprint sensing die 410 is disposed on an upper surface of the bottom dielectric layer 310 and is electrically connected to the signal paths (e.g. formed by a metal layer 570) on an upper surface of the bottom dielectric layer 310 through the bonding wires 590 or solder balls, so as to provide the sensed fingerprint information of the user's finger to other modules (e.g. the function module) or circuits through the signal paths on the upper surface of the bottom dielectric layer 310, a plurality of vias 530A and 530B, and the signal paths (e.g. formed by a metal layer 580) on a lower surface of the bottom dielectric layer 310 for subsequent processes. In the multi-layer PCB 300, it should be noted that the connection relationship between the signal paths of the fingerprint sensing die 410 and the bottom dielectric layer 310 is determined according to actual applications. Moreover, the signal paths are formed on the upper surface and the lower surface of the bottom dielectric layer 310 through the corresponding metal layers (e.g. the metal layer 570 or 580). Furthermore, according to actual applications, the signal paths disposed on the upper surface of the bottom dielectric layer 310 are electrically connected to the signal paths disposed on the lower surface of the bottom dielectric layer 310 through the vias of the bottom dielectric layer 310 (e.g. the vias 530A or 530B).

In FIG. 5, the molding compound 510 completely covers the fingerprint sensing die 410 and fills the trench 340. Moreover, the molding compound 510 is in direct contact with the bottom dielectric layer 310, the intermediate dielectric layer 320 and the top dielectric layer 330. It should be noted that an upper surface of the molding compound 510 and an upper surface of the top dielectric layer 330 are coplanar. Furthermore, a lower surface of the molding compound 510 and a lower surface of the intermediate dielectric layer 320 are coplanar. Due to a portion of the intermediate dielectric layer 320 and a portion of the top dielectric layer 330 being dug out, the areas of the intermediate dielectric layer 320 and the top dielectric layer 330 are smaller than the area of the bottom dielectric layer 310. Furthermore, the intermediate dielectric layer 320 and the top dielectric layer 330 have the same area. A metal layer 540 is disposed on an upper surface of the top dielectric layer 330, wherein the metal layer 540 fully or partially covers the upper surface of the top dielectric layer 330. Thus, the molding compound 510 is surrounded by the metal layer 540. Moreover, the metal layer 540 is coupled to a ground plane 550 disposed on a lower surface of the bottom dielectric layer 310 through a plurality of through holes 520A and 520B disposed on the multi-layer PCB 300. In the embodiment, the ground plane 550 is coupled to a ground of the electronic device. In order to simplify the description, configuration of the solder resists (SR) of the multi-layer PCB 300 will not be described further.

When an ESD event occurs, ESD energy $E_{ESD}$ from the top of the fingerprint sensor 400 is speedily transmitted to the ground plane 550 on the multi-layer PCB 300 through the metal layer 540 so as to discharge the ESD energy $E_{ESD}$. For example, when the ESD energy $E_{ESD}$ is released to the metal layer 540 (as shown in label 560), the ESD energy $E_{ESD}$ is transmitted to the nearest through hole 520B through the metal layer 540, and the ESD energy $E_{ESD}$ is discharged to the ground plane 550 of the multi-layer PCB 300. Thus, the ESD energy $E_{ESD}$ is transmitted to the ground of the function module of the electronic device (e.g. the function module 120 of FIG. 1) through a discharge path formed by the metal layer 540, the through holes 520B, and the ground plane 550, wherein the discharge path does not pass through the fingerprint sensing die 410. In the electronic device, the ground of the function module is coupled to a larger ground plane, thereby quickly providing a discharge path. Therefore, the ESD energy $E_{ESD}$ will not damage the fingerprint sensing die 410. Furthermore, compared with a conventional fingerprint sensor having an additional ESD ring (e.g. a conductive strip), the manufacturing cost is decreased by disposing the metal layer 540 on the multi-layer PCB 300. In general, the metal layer on a PCB is formed by aluminum, copper and so on. Moreover, in response to the shape and size of the trench 340 of the multi-layer PCB 300, the shapes and the amounts of the metal layers 540 can be adjusted appropriately. It should be noted that the amounts and positions of the through holes 520A and 520B are determined according to different applications. In addition to providing a discharge path, the metal layer 540 coupled to the ground plane 550 also improve the anti-interference capability of the fingerprint sensor 400.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fingerprint sensor, comprising:
   a multi-layer printed circuit board (PCB), comprising:
      a bottom dielectric layer;
      at least one intermediate dielectric layer disposed on the bottom dielectric layer;
      a top dielectric layer disposed on the intermediate dielectric layer; and
      a trench, wherein the trench is formed by digging out a portion of the intermediate dielectric layer and a portion of the top dielectric layer;
   a fingerprint sensing die disposed in the trench of the multi-layer PCB and mounted on an upper surface of the bottom dielectric layer of the multi-layer PCB, comprising:
      a sensing array, for sensing fingerprint information of a user; and
   a molding compound,
   wherein the fingerprint sensing die is completely covered by the molding compound, and the trench of the multi-layer PCB is filled with the molding compound,
   wherein the multi-layer PCB further comprises:
      a first metal layer disposed on an upper surface of the bottom dielectric layer and electrically connected to the fingerprint sensing die;
      a second metal layer disposed on a lower surface of the bottom dielectric layer; and
      a plurality of vias disposed in the bottom dielectric layer,
   wherein the first metal layer is electrically connected to the second metal layer through the vias, so as to transmit the fingerprint information of the user from the fingerprint sensing die to a function module.

2. The fingerprint sensor as claimed in claim 1, wherein an upper surface of the molding compound and an upper surface of the top dielectric layer are coplanar.

3. The fingerprint sensor as claimed in claim 1, wherein a lower surface of the molding compound and a lower surface of the intermediate dielectric layer are coplanar.

4. The fingerprint sensor as claimed in claim 2, wherein the top dielectric layer and the intermediate dielectric layer have the same area.

5. The fingerprint sensor as claimed in claim 4, wherein an area of the bottom dielectric layer is greater than an area of the top dielectric layer.

6. The fingerprint sensor as claimed in claim 1, wherein the multi-layer PCB further comprises:
   a third metal layer disposed on an upper surface of the top dielectric layer;
   a ground plane disposed on a lower surface of the bottom dielectric layer; and
   a plurality of through holes disposed through the top dielectric layer, the intermediate dielectric layer, and the bottom dielectric layer,
   wherein the third metal layer is electrically connected to the ground plane through the through holes.

7. The fingerprint sensor as claimed in claim 6, wherein when an ESD event occurs, ESD energy is discharged from the third metal layer to the ground plane through the through holes without passing through the fingerprint sensing die.

8. The fingerprint sensor as claimed in claim 1, wherein the molding compound has a high dielectric constant.

9. The fingerprint sensor as claimed in claim 1, wherein a thickness of the intermediate dielectric layer is greater than that of the top dielectric layer and the bottom dielectric layer.

10. The fingerprint sensor as claimed in claim 1, wherein the trench of the multi-layer PCB is completely filled with the molding compound.

11. The fingerprint sensor as claimed in claim 1, wherein the molding compound is surrounded by the multi-layer printed circuit board.

* * * * *